United States Patent
Park et al.

(10) Patent No.: US 11,402,899 B2
(45) Date of Patent: Aug. 2, 2022

(54) ELECTRONIC APPARATUS

(71) Applicant: Samsung Display Co., Ltd., Yongin-Si (KR)

(72) Inventors: Sungkook Park, Suwon-si (KR); Hyosun Kim, Seongnam-si (KR); Young-Jun Seo, Suwon-si (KR); Yongwoo Yi, Hwaseong-si (KR)

(73) Assignee: Samsung Display Co., Ltd.

( * ) Notice: Subject to any disclaimer, the term of this patent is extended or adjusted under 35 U.S.C. 154(b) by 124 days.

(21) Appl. No.: 16/925,257

(22) Filed: Jul. 9, 2020

(65) Prior Publication Data

US 2021/0096643 A1    Apr. 1, 2021

(30) Foreign Application Priority Data

Sep. 30, 2019  (KR) .................. 10-2019-0121038

(51) Int. Cl.
| | |
|---|---|
| *G06F 3/01* | (2006.01) |
| *H01L 27/32* | (2006.01) |
| *H04N 5/225* | (2006.01) |
| *G06F 3/041* | (2006.01) |
| *G06T 7/20* | (2017.01) |
| *G06F 3/044* | (2006.01) |

(52) U.S. Cl.
CPC ............ *G06F 3/013* (2013.01); *G06F 3/0416* (2013.01); *G06T 7/20* (2013.01); *H01L 27/3244* (2013.01); *H04N 5/2257* (2013.01); *G06F 3/0446* (2019.05); *G06T 2207/10048* (2013.01); *G06T 2207/30201* (2013.01)

(58) Field of Classification Search
CPC ......... G06F 3/013; G06F 3/0416; G06T 7/20; H01L 27/3244; H04N 5/2257
USPC ........................ 345/173–175, 633; 359/630
See application file for complete search history.

(56) References Cited

U.S. PATENT DOCUMENTS

| | | | |
|---|---|---|---|
| 5,583,795 A * | 12/1996 | Smyth ................ | A61B 3/0025 359/630 |
| 7,572,008 B2 | 8/2009 | Elvesjo et al. | |
| 8,654,524 B2 | 2/2014 | Pance et al. | |
| 9,489,739 B2 | 11/2016 | Kruglick | |
| 10,429,905 B2 | 10/2019 | Lee et al. | |
| 2008/0074401 A1* | 3/2008 | Chung ................ | G02F 1/1368 345/175 |
| 2014/0028575 A1 | 1/2014 | Parivar et al. | |
| 2014/0059583 A1 | 2/2014 | Matsushita et al. | |

(Continued)

FOREIGN PATENT DOCUMENTS

| | | |
|---|---|---|
| KR | 10-2018-0015524 A | 2/2018 |
| KR | 10-2018-0041642 A | 4/2018 |

(Continued)

*Primary Examiner* — Prabodh M Dharia
(74) *Attorney, Agent, or Firm* — Innovation Counsel LLP

(57) ABSTRACT

An electronic apparatus includes an infrared ray module, a camera module, and a display module including an active area through which an image is displayed and a non-active area adjacent to the active area and including a high transmittance area and a low transmittance area which are defined in the active area. The high transmittance area includes a first transmission area and a second transmission area, the camera module overlaps the first transmission area, and the infrared ray module overlaps the second transmission area.

20 Claims, 14 Drawing Sheets

(56) References Cited

U.S. PATENT DOCUMENTS

| | | | |
|---|---|---|---|
| 2015/0317837 A1* | 11/2015 | Sholudko | G06F 3/167 |
| | | | 345/633 |
| 2016/0085358 A1* | 3/2016 | Palanisamy | G09G 5/00 |
| | | | 345/173 |
| 2016/0276129 A1* | 9/2016 | Stevens | G03F 7/20 |
| 2018/0307269 A1 | 10/2018 | Pantel | |
| 2019/0057642 A1 | 2/2019 | Kim et al. | |
| 2019/0158819 A1 | 5/2019 | Hong et al. | |
| 2019/0355930 A1* | 11/2019 | Lee | H01L 51/5253 |
| 2020/0106046 A1* | 4/2020 | Kim | H01L 51/0097 |
| 2020/0312237 A1* | 10/2020 | He | G09G 3/3225 |
| 2020/0320959 A1* | 10/2020 | Ryu | G09G 5/14 |

FOREIGN PATENT DOCUMENTS

| | | |
|---|---|---|
| KR | 10-1927438 B1 | 12/2018 |
| KR | 10-2019-0019275 A | 2/2019 |

* cited by examiner

ELECTRONIC APPARATUS

CROSS-REFERENCE TO RELATED APPLICATION

This U.S. non-provisional patent application claims priority under 35 U.S.C. § 119 to Korean Patent Application No. 10-2019-0121038, filed on Sep. 30, 2019; the Korean Patent Application is incorporated by reference.

BACKGROUND

1. Field of Disclosure

The technical field relates to an electronic apparatus.

2. Description of the Related Art

An eye-tracking technology may recognize the movement of a user's pupil(s) for control or operation of an electronic device. The eye-tracking technology may be applied to a smartphone and/or a virtual reality (VR) device.

SUMMARY

Embodiments may be related to an electronic apparatus including an infrared unit and including a display panel that includes a transmission area for transmitting an infrared ray emitted by the infrared unit.

Embodiments may be related to an electronic apparatus including an infrared ray unit and a camera unit for tracking a user's gaze.

Embodiments may be related to an electronic apparatus including a camera module, an infrared ray module, and a display module including an active area through which an image is displayed and a pixel is disposed, and a non-active area adjacent to the active area and including a high transmittance area and a low transmittance area which are defined in the active area. The high transmittance area includes a first transmission area and a second transmission area, the camera module overlaps the first transmission area, and the infrared ray module overlaps the second transmission area.

The infrared ray module and the camera module are disposed under the display module.

The high transmittance area and the non-active area do not overlap the pixel, and the low transmittance area overlaps the pixel.

The display module is provided with an opening defined in the high transmittance area.

The display module includes a display panel, and a first module hole and a second module hole are defined in the display panel to respectively penetrate the first transmission area and the second transmission area.

The second transmission area has a size smaller than a size of the first transmission area.

The second transmission area is disposed adjacent to the first transmission area.

The second transmission area is provided in a plural number.

Edge areas are defined at both sides in a first direction of the active area, and the second transmission areas are disposed to be aligned in a second direction crossing the first direction in the edge areas.

The second transmission areas disposed in the edge area on one side among the both sides are disposed adjacent to the first transmission area, and the second transmission areas disposed in the edge area on the other side among the both sides are disposed to be spaced apart from the first transmission area.

The second transmission areas include a first area adjacent to the first transmission area and a second area not adjacent to the first transmission area.

Each of the first area and the second area is provided in a plural number, the first areas are disposed to surround the first transmission area, and the second areas are disposed adjacent to the non-active area, which is spaced apart from the first transmission area.

The first areas have a size different from a size of the second areas.

Embodiments may be related to an electronic apparatus including an infrared ray module emitting an infrared ray toward a user pupil direction to track a user's gaze, a camera module receiving the infrared ray reflected by the user's pupil to acquire information on the user's gaze, a control module generating a gaze tracking image from a raw image based on the information on the user gaze, and a display module including an active area through which the gaze tracking image is displayed and a non-active area adjacent to the active area and including a high transmittance area and a low transmittance area which are defined in the active area. The high transmittance area includes a first transmission area and a second transmission area, the camera module overlaps the first transmission area, and the infrared ray module overlaps the second transmission area.

The display module transmits the infrared ray incident into the camera module in the first transmission area and transmits the infrared ray emitted from the infrared ray module in the second transmission area.

The control module controls a power supply module or an input sensing unit based on the information on the user's gaze.

Embodiments may be related to an electronic apparatus including a display module including an active area through which an image is displayed and a non-active area adjacent to the active area and including a first module hole and a second module hole, which are defined in the active area, a window disposed on the display module, a camera module overlapping the first module hole, and an infrared ray module overlapping the second module hole.

The electronic apparatus further includes a first light blocking area adjacent to the first module hole and defined on the window and the display module and a second light blocking area adjacent to the second module hole and defined on the window and the display module.

The window includes a first module area and a second module area, which are defined therein, the first module hole overlaps the first module area, and the second module hole overlaps the second module area.

An embodiment may be related to an electronic apparatus. The electronic apparatus may include a camera unit, a first infrared ray unit, and a display module. The display module may include pixels, an infrared reception hole, and a first infrared transmission hole. The pixels may surround at least one of the infrared reception hole and the first infrared transmission hole in a plan view of the electronic apparatus. The infrared reception hole may expose the camera unit. The first infrared transmission hole may expose the first infrared ray unit.

The electronic apparatus may include a window. The display module may be disposed between the window and each of the first infrared ray unit and the camera unit.

A first subset of the pixels may surround the infrared reception hole. A second subset of the pixels may surround the first infrared transmission hole.

The display module may include a display element layer. The display element layer may include light emitting elements. Each of the infrared reception hole and the first infrared transmission hole may extend through the display element layer.

The display module may include a display panel. The display panel may include the pixels. Each of the infrared reception hole and the first infrared transmission hole may extend through the display panel.

The first infrared transmission hole may be smaller than the infrared reception hole in the plan view of the electronic apparatus.

The infrared reception hole and the first infrared transmission hole may be disposed at a same quarter of the electronic apparatus in the plan view of the electronic apparatus.

The electronic apparatus may include a second infrared ray unit. The display module may include a second infrared transmission hole. The second infrared transmission hole may expose the second infrared ray unit.

Each of the first infrared transmission hole and the second infrared transmission hole may be positioned between the infrared reception hole and a first edge of the electronic apparatus in the plan view of the electronic apparatus. The first infrared transmission hole may be aligned with the second infrared transmission hole in a direction parallel to the first edge of the electronic apparatus.

The electronic apparatus may include a third infrared ray unit and a fourth infrared ray unit. The display module may include a third infrared transmission hole and a fourth infrared transmission hole. The third infrared transmission hole and the fourth infrared transmission hole may respectively expose the third infrared ray unit and the fourth infrared ray unit. Each of the third infrared transmission hole and the fourth infrared transmission hole may be positioned between the infrared reception hole and a second edge of the electronic apparatus in the plan view of the electronic apparatus. The third infrared transmission hole may be aligned with the fourth infrared transmission hole in a direction parallel to the second edge of the electronic apparatus.

The first infrared transmission hole may be positioned closer to the infrared reception hole than the second infrared transmission hole is.

The infrared reception hole may be positioned between the first infrared transmission hole and the second infrared transmission hole.

The first infrared transmission hole may be larger or smaller than the second infrared transmission hole.

An embodiment may be related to an electronic apparatus. The electronic apparatus may include infrared ray units, a camera unit, a control module, and a display module. The infrared ray units may sequentially emit emitted infrared rays. The camera unit may sequentially receive reflected infrared rays that respectfully correspond to the emitted infrared rays. The control module may be electrically connected to the camera unit. At least one of the camera unit and the control module may generate tracking information based on the reflected infrared rays. The display module may be electrically connected to the control module and may include pixels, an infrared reception hole, and infrared transmission holes. The pixels may display an image in response to control signals provided by the control module. The infrared reception hole may expose the camera unit to the reflected infrared rays. The infrared transmission holes may respectfully expose the infrared ray units to permit transmission of the emitted infrared rays.

The infrared transmission holes may include a first infrared transmission hole and a second infrared transmission hole. The first infrared transmission hole may be positioned closer to the infrared reception hole than the second infrared transmission hole is.

The electronic apparatus may include a power supply module and an input sensing unit each electrically connected to the control module. The control module may control at least one of the power supply module and the input sensing unit based on the tracking information.

The infrared transmission holes may include first-type infrared transmission holes and second-type infrared transmission holes. The first-type infrared transmission holes may surround the infrared reception hole. The second-type infrared transmission holes may be aligned with each other and may be spaced at equal intervals.

An embodiment may be related to an electronic apparatus. The electronic apparatus may include a display module, a window, a camera unit, and an infrared ray unit. The display module may include pixels, an infrared reception hole, and an infrared transmission hole. The pixels may surround each of the infrared reception hole and the infrared transmission hole and may display an image. The window may be disposed on the display module. The camera unit may be exposed by the infrared reception hole. The infrared ray unit may be exposed by the infrared transmission hole.

The electronic apparatus may include a first light blocking member and a second light blocking member. The first light blocking member may surround the infrared reception hole and may be disposed on at least one of the window and the display module. The second light blocking member may surround the infrared transmission hole and may be disposed on one or more of the window and the display module.

The electronic apparatus may include a bezel member disposed along an edge of the window. A material of the bezel member may be identical to at least one of a material of the first light blocking member and a material of the second light blocking member.

According to embodiments, an electronic apparatus includes an infrared ray unit disposed within a display panel in a plan view of the electronic apparatus. Therefore, no separate device may be required for tracking a user's gaze. The same process may be used for the placement of both the infrared unit and a camera unit in the electronic apparatus. Advantageously, manufacturing efficiency and cost associated with the electronic apparatus may be optimized.

DETAILED DESCRIPTION

Figure 1:
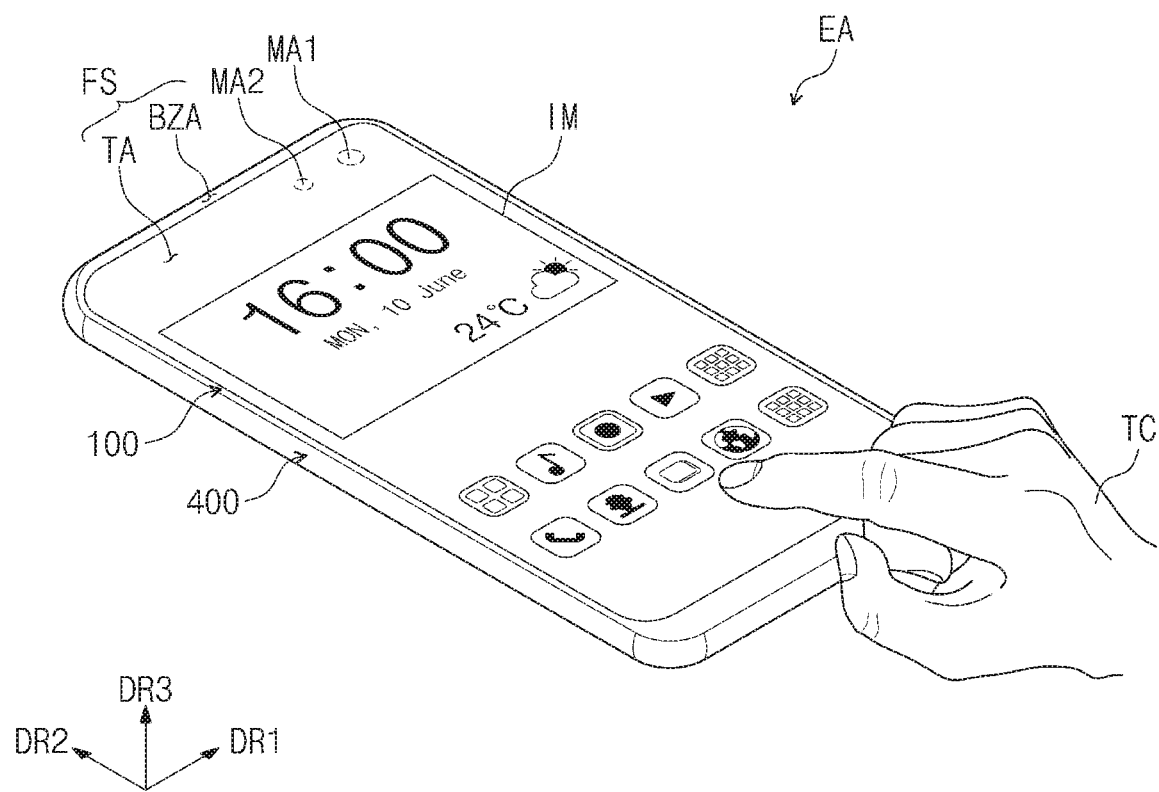
FIG. 1 is a perspective view showing an electronic apparatus according to an embodiment.

In the present disclosure, although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

When a first element is referred to as being "on," "connected to," or "coupled to" a second element, the first element be directly on, connected to, or directly coupled to the second element, or one or more intervening elements may be present between the first element and the second element.

Like numerals may refer to like elements. In the drawings, dimension of components may be exaggerated for effective description and/or illustration. The term "and/or" may indicate one or more of the associated items.

The singular forms, "a", "an" and "the" may indicate plural forms, unless the context clearly indicates otherwise.

Unless otherwise defined, all terms (including technical and scientific terms) used herein have the same meaning as commonly understood by one of ordinary skill in the art. The terms should not be interpreted in an idealized or overly formal sense unless expressly so defined.

The term "connect" may mean "electrically connect" or "electrically connected through no intervening transistor." The term "insulate" may mean "electrically insulate" or "electrically isolate." The term "drive" may mean "operate" or "control." The term "defined" may mean "positioned," "disposed," or "formed." The term "pattern" may mean "member."

Figure 2:
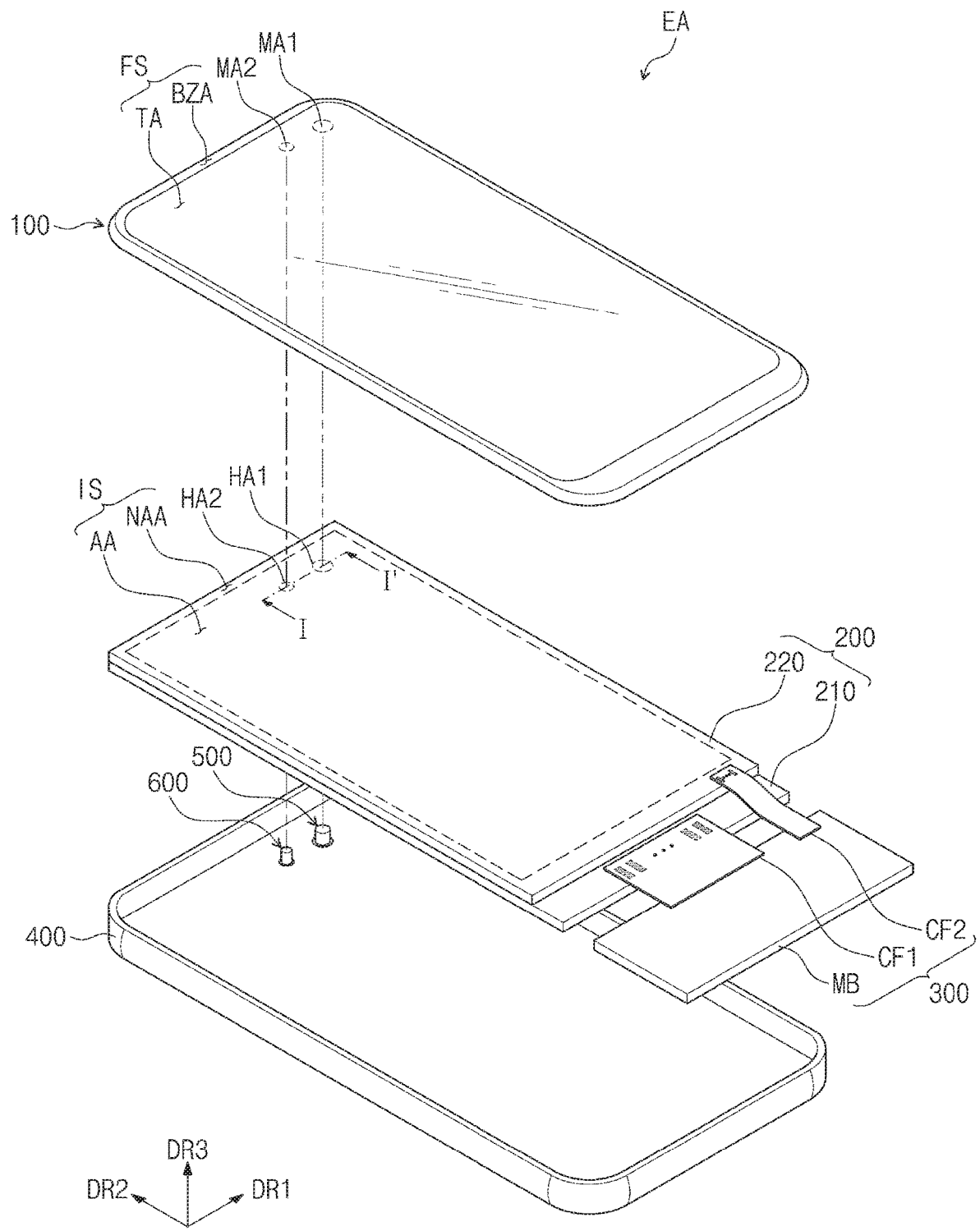
FIG. 2 is an exploded view showing an electronic apparatus according to an embodiment.
Figure 3:
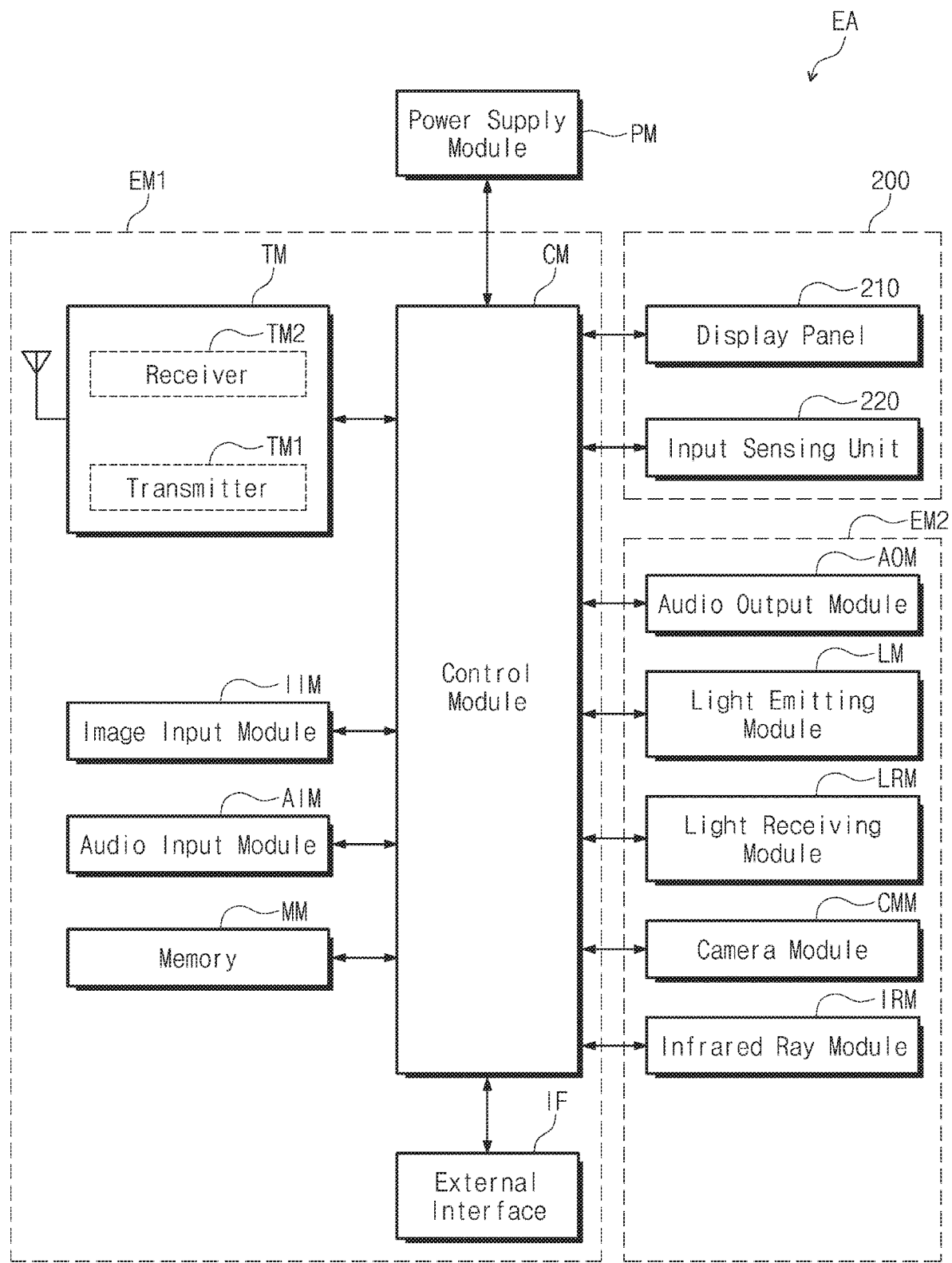
FIG. 3 is a block diagram showing an electronic apparatus according to an embodiment.

FIG. 1 is a perspective view showing an electronic apparatus EA according to an embodiment. FIG. 2 is an exploded view showing the electronic apparatus EA according to an embodiment. FIG. 3 is a block diagram showing the electronic apparatus EA according to an embodiment.

Referring to FIGS. 1 to 3, the electronic apparatus EA may be activated in response to electrical signals to display an image. The electronic apparatus EA may be, for example, a smartphone, a tablet computer, a notebook computer, a computer, or a television set.

The electronic apparatus EA may display an image IM in a third direction DR3 through a display surface FS substantially parallel to each of a first direction DR1 and a second direction DR2. The display surface FS may be a front surface of the electronic apparatus EA and a front surface of a window 100. Hereinafter, the display surface and the front surface of the electronic apparatus EA and the front surface of the window 100 are assigned with the same reference numeral. The image IM includes a still image as well as a motion image. FIG. 1 shows a clock widget and application icons as a representative example of the image IM.

Front (or upper) and rear (or lower) surfaces of each member may be defined with respect to a direction in which the image IM is displayed. The front and rear surfaces are opposite each other in the third direction DR3, and a normal line direction of each of the front and rear surfaces is substantially parallel to the third direction DR3. Directions indicated by the first, second, and third directions DR1, DR2, and DR3 are relative.

The electronic apparatus EA may include the window 100, a display module 200, a driving circuit unit 300, a housing 400, a camera unit 500, and an infrared ray unit 600. The window 100 and the housing 400 are coupled to each other to form an exterior of the electronic apparatus EA.

The window 100 may include an optically transparent insulating material. For example, the window 100 may include glass or plastic. The window 100 may have a single-layer or multi-layer structure. For example, the window 100 may include a plurality of plastic films attached to each other by an adhesive or may include a glass substrate and a plastic film attached to the glass substrate by an adhesive.

The window 100 may be divided into a transmission area TA and a bezel area BZA in a plan view. The expression "in a plan view" may mean a state as viewed in the third direction DR3. The expression "thickness direction" may mean the third direction DR3.

The transmission area TA may be optically transparent. The bezel area BZA may have a light transmittance relatively lower than that of the transmission area TA. The bezel area BZA may define a shape of the transmission area TA. The bezel area BZA may abut the transmission area TA and may surround the transmission area TA.

The bezel area BZA may have a predetermined color. The bezel area BZA may cover a non-active area NAA of the display module 200 to prevent the non-active area NAA from being visible. The bezel area BZA may be optional.

A first module area MA1 (of the window 100) may overlap the camera unit 500. The electronic apparatus EA may receive external signals for the camera unit 500 or may apply signals output from the camera unit 500 to the outside through the first module area MA1. The first module area MA1 may overlap the transmission area TA. Accordingly, the size of the bezel area BZA may not include the first module area MA1 and may be minimized.

A second module area MA2 (of the window 100) may overlap the infrared ray unit 600. The electronic apparatus EA may provide an infrared ray output from the infrared ray unit 600 to the outside through the second module area MA2. The electronic apparatus EA may provide the infrared ray from the infrared ray unit 600 toward a user pupil(s) through the second module area MA2.

In FIGS. 1 and 2, the first and second module areas MA1 and MA2 are in a right upper end of the transmission area TA. The first and second module areas MA1 and MA2 may be positioned in various areas, such as a left upper end of the transmission area TA, a center of the transmission area TA, a left lower end of the transmission area TA, or a right lower end of the transmission area TA.

As shown in FIG. 2, the display module 200 may be disposed under the window 100. The term "under" may mean a direction opposite to the direction in which the display module 200 displays the image IM. The display module 200 may display the image IM and may sense an external input TC. The display module 200 may include a front surface IS including an active area AA and the non-active area NAA. The active area AA may be activated in response to electrical signals.

The active area AA may be the area in which the image IM is displayed and the external input TC is sensed. The transmission area TA may overlap at least the active area AA. The transmission area TA may partially or entirely overlap the active area AA. The user may view the image IM through the transmission area TA or may input the external input TC through the transmission area TA.

The non-active area NAA may be covered by the bezel area BZA. The non-active area NAA may abut the active area AA. The non-active area NAA may surround the active area AA. A driving circuit or a driving line may be disposed in the non-active area NAA to drive the active area AA.

The display module 200 may have a flat shape in the active area AA and the non-active area NAA. The display module 200 may be partially bent in the non-active area NAA. The display module 200 may be bent toward a rear surface of the electronic apparatus EA in the non-active area NAA, and thus, the size of the bezel area BZA is reduced in the front surface of the electronic apparatus EA. The display module 200 may have a partially-bent shape in the active area AA. The non-active area NAA may be optional.

The display module 200 may include a display panel 210 and an input sensing unit 220.

The display panel 210 may generate the image IM. The image IM generated by the display panel 210 may be displayed through the front surface IS of the display module 200 and viewed by the user through the transmission area TA.

The input sensing unit 220 may sense the external input TC provided through the window 100. The external input TC may be a user input. The user input may include various forms of external inputs, such as a portion of the user's body, light, heat, pen, or pressure. The external input TC is shown as a touch operation using the user's hand applied via the display surface FS of the electronic apparatus EA. The external input TC may be provided in various forms, and the electronic apparatus EA may sense the external input TC applied to a side or rear surface of the electronic apparatus EA depending on a structure of the electronic apparatus EA.

The driving circuit unit 300 may be electrically connected to the display panel 210 and the input sensing unit 220. The driving circuit unit 300 may include a main circuit board MB, a first flexible film CF1, and a second flexible film CF2.

The first flexible film CF1 may be electrically connected to the display panel 210. The first flexible film CF1 may connect the display panel 210 and the main circuit board MB. The first flexible film CF1 may be connected to pads (display pads) of the display panel 210, which are arranged in the non-active area NAA. The first flexible film CF1 may provide electrical signals to the display panel 210 to drive the display panel 210. The electrical signals may be generated by the first flexible film CF1 or the main circuit board MB.

The second flexible film CF2 may be electrically connected to the input sensing unit 220. The second flexible film CF2 may connect the input sensing unit 220 and the main circuit board MB. The second flexible film CF2 may be connected to pads (sensing pads) of the input sensing unit 220, which are arranged in the non-active area NAA. The second flexible film CF2 may provide electrical signals to the input sensing unit 220 to drive the input sensing unit 220. The electrical signals may be generated by the second flexible film CF2 or the main circuit board MB.

The main circuit board MB may include various driving circuits used to drive the display module 200 or a connector used to supply a power. The first flexible film CF1 and the second flexible film CF2 may be connected to the main circuit board MB. The display module 200 may be easily controlled by using one main circuit board MB, however, this is merely one possibility. In the display module 200 according to another embodiment, the display panel 210 and the input sensing unit 220 may be connected to different main circuit boards, one of the first flexible film CF1 and the second flexible film CF2 may not be connected to the main circuit board MB.

An area of the display module 200 corresponding to the first and second module areas MA1 and MA2 may have a relatively higher transmittance than the active area AA that does not overlap the first and second module areas MA1 and MA2. Components of the display panel 210 and/or components of the input sensing unit 220 may not overlap the module areas MA1 and MA2. Accordingly, the camera unit 500 and the infrared ray unit 600 may effectively transmit and/or receive signals through the first and second module areas MA1 and MA2.

Figure 5:
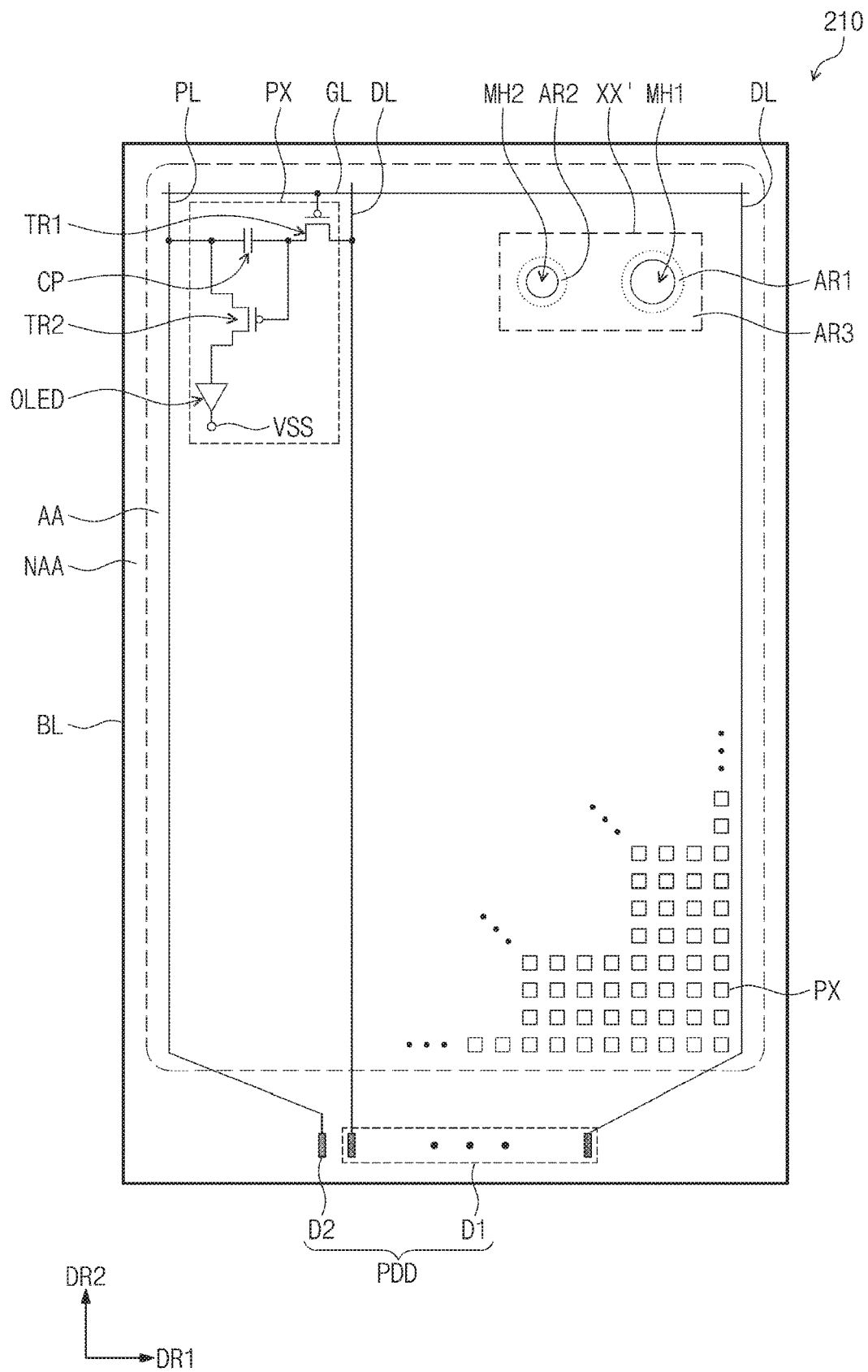
FIG. 5 is a plan view showing a display panel according to an embodiment.
Figure 6:
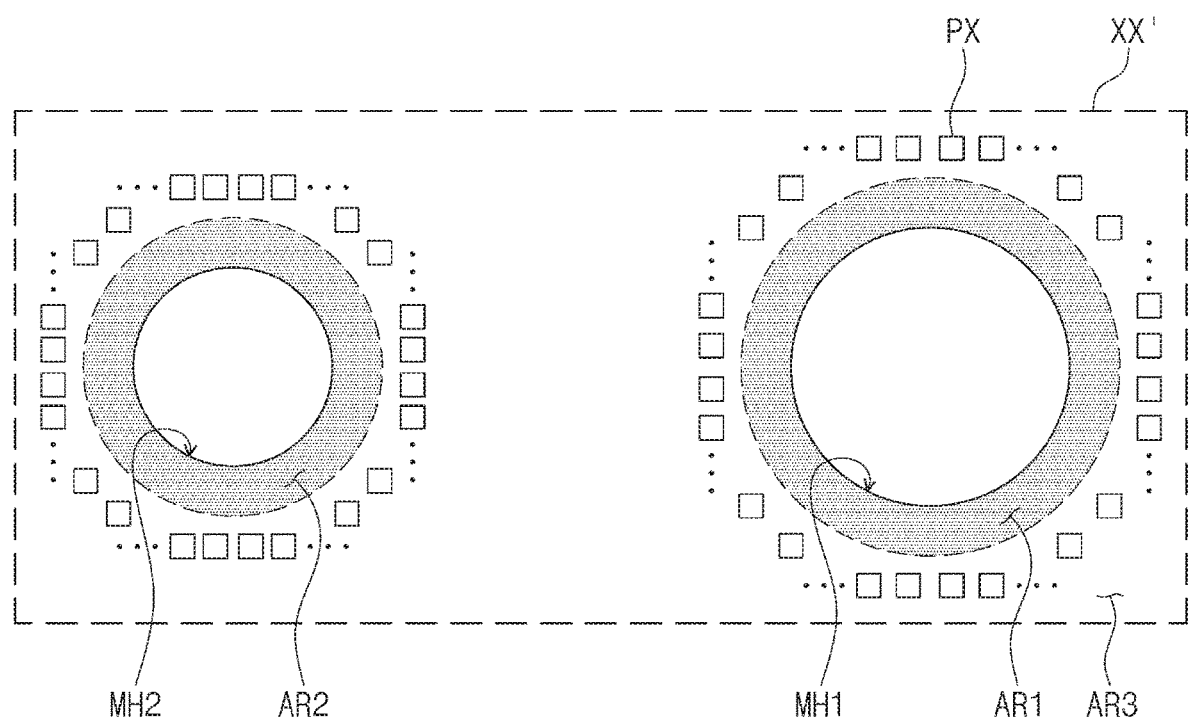
FIG. 6 is a plan view showing an area XX' of FIG. 5 according to an embodiment.
Figure 7:
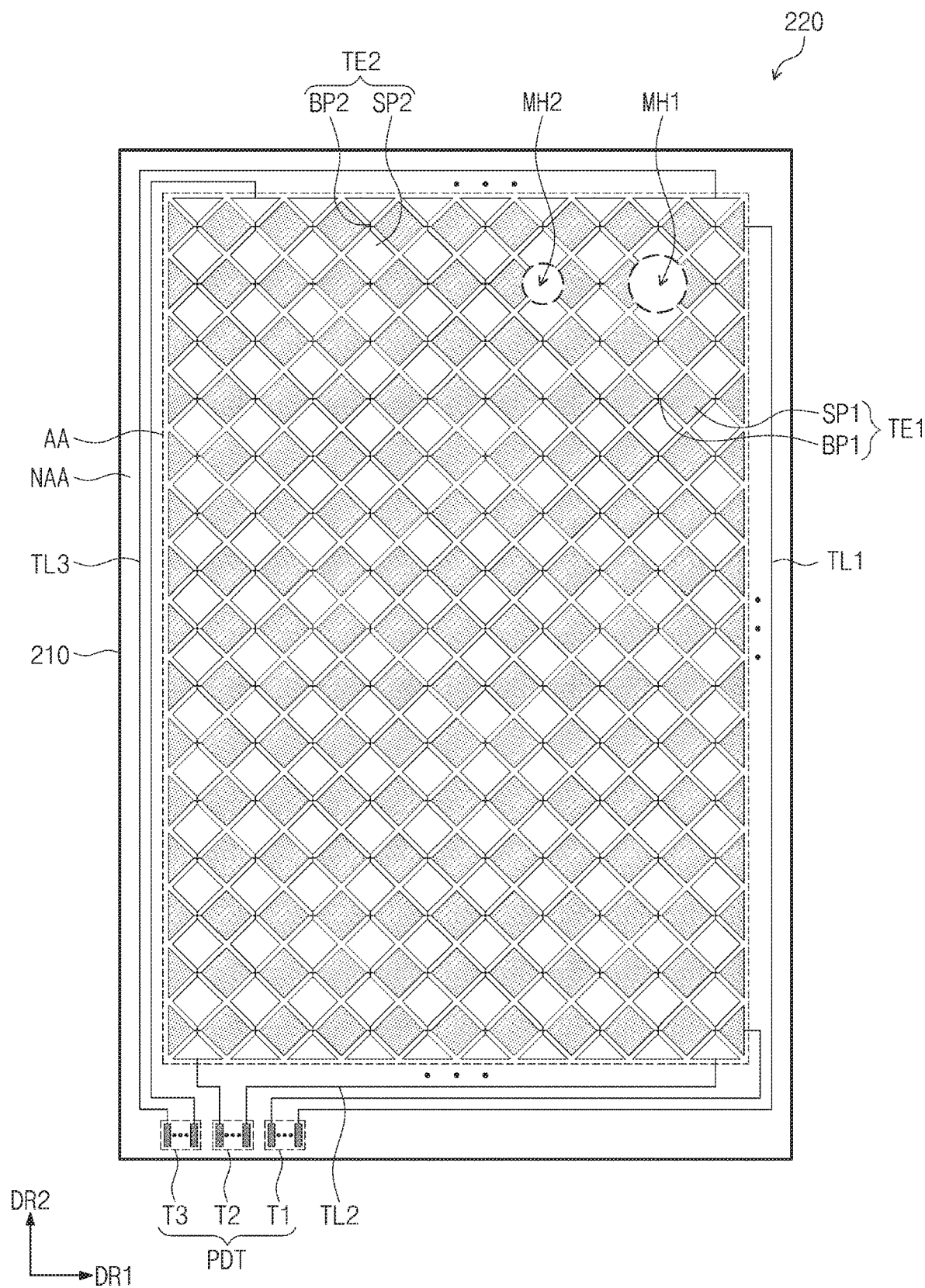
FIG. 7 is a plan view showing an input sensing unit according to an embodiment.

In FIG. 2, the display module 200 may include a first transmission area HA1 and a second transmission area HA2, which respectively correspond to the first and second module areas MA1 and MA2. The first transmission area HA2 and the second transmission area HA2 may be positioned in the active area AA and may be/include holes that penetrate through the display module 200. Referring to FIGS. 5 to 7, the display panel 210 and the input sensing unit 220 may be penetrated by a first module hole MH1 (or infrared reception hole MH1) and a second module hole MH2 (or infrared transmission hole MH2) of the first transmission area HA1 and the second transmission area HA2. The first module hole MH1 and the second module hole MH2 may be avoided/circumvented by components of the display panel 210 and the input sensing unit 220. As the first transmission area HA1 and the second transmission area HA2 are positioned in the active area AA, the first module area MA1 and the second module area MA2 may be positioned in the transmission area TA.

The camera unit 500 may overlap the first transmission area HA1 and the first module area MA1. The camera unit 500 may be disposed under the display module 200, and at least a portion of the camera unit 500 may be accommodated in the first transmission area HA1. The camera unit 500 may receive an external input provided through the first transmission area HA1 or may output signals through the first transmission area HA1.

The infrared ray unit 600 may overlap the second transmission area HA2 and the second module area MA2. The infrared ray unit 600 may be disposed under the display module 200. The infrared ray unit 600 may be accommodated in the second transmission area HA2. The infrared ray unit 600 may emit the infrared ray to the outside through the second transmission area HA2. The infrared ray unit 600 may emit the infrared ray to the user pupil(s) through the second transmission area HA2.

The housing 400 may be coupled to the window 100 and may provide an inner space. The display module 200 and the camera unit 500 may be accommodated in the inner space.

The housing 400 may include a material with a relatively high rigidity. The housing 400 may include a plurality of frames and/or plates containing one or more of glass, plastic, and metal. The housing 400 may protect the components of the electronic apparatus EA from external impacts.

Referring to FIG. 3, the electronic apparatus EA may include the display module 200, a power supply module PM, a first electronic module EM1, and a second electronic module EM2. The display module 200, the power supply module PM, the first electronic module EM1, and the second electronic module EM2 may be electrically connected to each other.

The power supply module PM may supply a power necessary for the overall operation of the electronic apparatus EA. The power supply module PM may include a battery module.

The first electronic module EM1 and the second electronic module EM2 may include various functional modules to operate the electronic apparatus EA.

The first electronic module EM1 may be mounted directly on a mother board electrically connected to the display module 200 or may be electrically connected to the mother board through a connector (not shown) after being mounted on a separate board.

The first electronic module EM1 may include a control module CM, a wireless communication module TM, an image input module IIM, an audio input module AIM, a memory MM, and an external interface IF. Some of the modules may be electrically connected to the mother board through a flexible printed circuit board without being mounted on the mother board.

The control module CM may control the overall operation of the electronic apparatus EA. The control module CM may be a microprocessor. The control module CM may activate or deactivate the display module 200. The control module CM may control other modules, e.g., the image input module IIM or the audio input module AIM, based on a touch signal provided from the display module 200. The control module CM may receive user gaze information from the camera unit 500. The control module CM may control other modules based on the user gaze information. The control module CM may control the display panel 210, the power supply module PM, and the input sensing unit 220 based on the user gaze information.

The wireless communication module TM may transmit/receive a wireless signal to/from another terminal using a Bluetooth or Wi-Fi link. The wireless communication module TM may transmit/receive a voice signal by using a communication line. The wireless communication module TM may include a transmitter TM1 that modulates a signal to be transmitted and transmits the modulated signal and a receiver TM2 that demodulates the signal applied thereto.

The image input module IIM may process an image signal and may convert the image signal into image data that may be displayed through the display module 200. The audio input module AIM may receive an external audio signal through a microphone in a recording mode and a voice recognition mode and may convert the audio signal into electrical voice data.

The external interface IF may serve as an interface between the control module CM and external devices, such as an external charger, a wired/wireless data port, and a card socket (e.g., a memory card and a SIM/UIM card).

The second electronic module EM2 may include an audio output module AOM, a light emitting module LM, a light receiving module LRM, and a camera module CMM, and an infrared ray module IRM. The components of the second electronic module EM2 may be mounted directly on the mother board, electrically connected to the display module 200 through a connector (not shown) after being mounted on a separate board, or electrically connected to the first electronic module EM1.

The audio output module AOM may convert and output the audio data provided from the wireless communication module TM or the audio data stored in the memory MM to the outside.

The light emitting module LM may generate and emit a light. The infrared ray module IRM may emit the infrared ray. The infrared ray module IRM and the light emitting module LM may include a light emitting diode (LED) element. The light receiving module LRM may sense the infrared ray. The light receiving module LRM may be activated when sensing an infrared ray equal to or greater than a predetermined level. The light receiving module LRM may include a complementary metal oxide semiconductor (CMOS) sensor. The infrared ray generated by the infrared ray module IRM may be incident into the light receiving module LRM after being reflected by an external object, e.g., a user's finger or face. The camera module CMM may photograph an image.

The camera unit 500 may include the camera module CMM and the light receiving module LRM. The infrared ray unit 600 may include the infrared ray module IRM and the light emitting module LM. The infrared ray unit 600 may emit an infrared ray through the second module area MA2 and the second transmission area HA2. The camera unit 500 may sense an external subject provided through the first module area MA1 and the first transmission area HA1 or may receive an infrared ray reflected by the user's pupil(s). The electronic apparatus may include a plurality of camera units 500 and/or a plurality of infrared ray units 600.

Figure 4A:
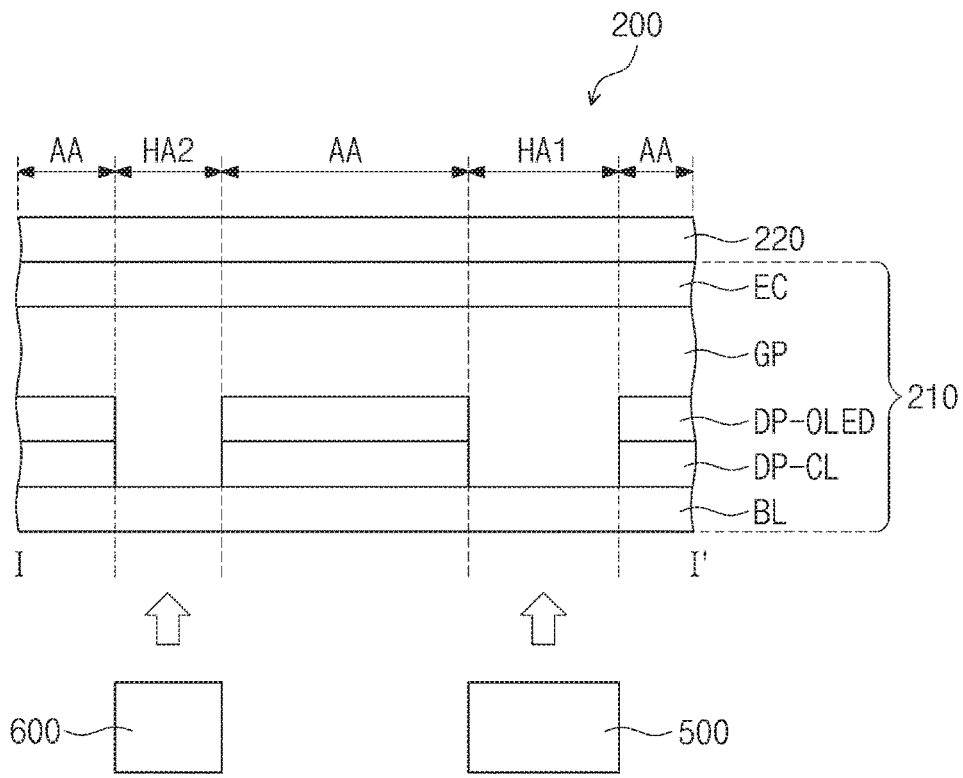
FIG. 4A is a cross-sectional view showing a display module according to an embodiment.
Figure 4B:
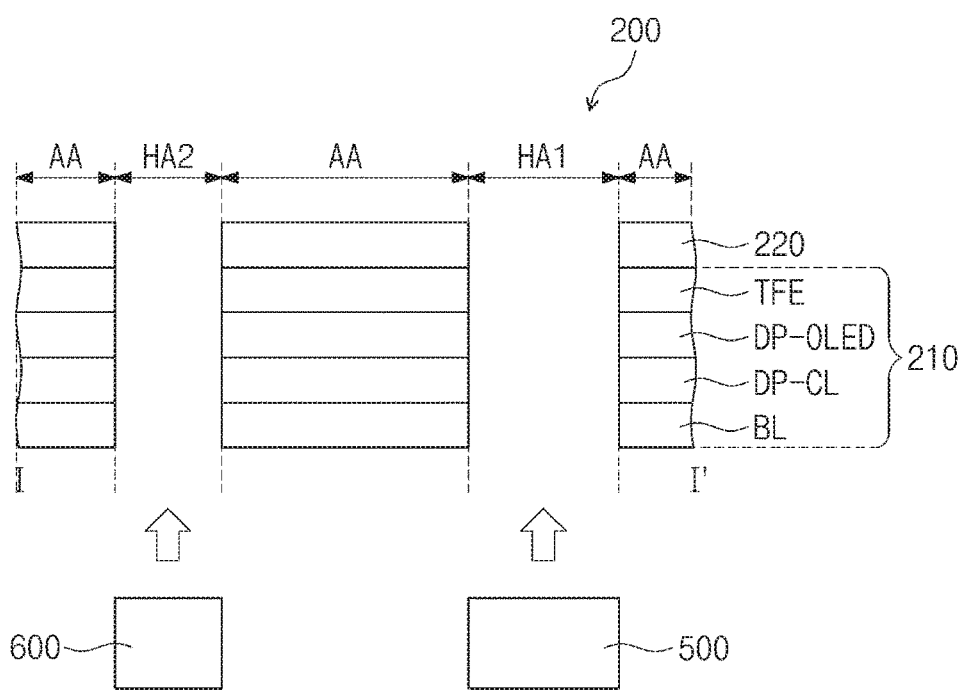
FIG. 4B is a cross-sectional view showing a display module according to an embodiment.

FIG. 4A shows a cross-sectional view of a rigid-type display module 200 according to an embodiment. FIG. 4B shows a cross-sectional view of a flexible-type display module 200 according to an embodiment. Components of the flexible-type display module 200, in addition to components of the rigid-type display module 200, may include a thin film encapsulation layer TFE.

In FIG. 4A, a rigid-type display panel 210 may include a base layer BL, a circuit element layer DP-CL disposed on the base layer BL, a display element layer DP-OLED disposed on the circuit element layer DL-CL, and an encapsulation substrate EC.

The base layer BL may include a glass substrate. The base layer BL may include a substrate having a constant refractive index in a visible light wavelength range. The circuit element layer DP-CL may include at least one insulating layer and a circuit element. The circuit element layer DP-CL may include at least a transistor. The insulating layer of the circuit element layer DP-CL may include at least one inorganic layer and/or at least one organic layer. The circuit element may include a signal line and a pixel driving circuit. The display element layer DP-OLED may include at least a light emitting element. The display element layer DP-OLED may include organic light emitting diodes as light emitting elements. The display element layer DP-OLED may include a pixel definition layer, e.g., an organic material. The encapsulation substrate EC may be a transparent substrate. The encapsulation substrate EC may include a glass substrate. The encapsulation substrate EC may include a substrate having a constant refractive index in a visible light wavelength range. The stacked structure from the base layer BL to the display element layer DP-OLED may be defined as a lower display substrate. A gap GP may be defined between the display element layer DP-OLED and the encapsulation substrate EC, and the gap GP may be filled with air or inert gas.

In FIG. 4B, the flexible-type display panel 210 may include a base layer BL, a circuit element layer DP-CL disposed on the base layer BL, a display element layer DP-OLED disposed on the circuit element layer DL-CL, and the thin film encapsulation layer TFE.

The thin film encapsulation layer TFE may encapsulate the display element layer DP-OLED. The thin film encapsulation layer TFE may include at least one insulating layer. The thin film encapsulation layer TFE may include at least one inorganic layer. The thin film encapsulation layer TFE may include at least one organic layer and at least one inorganic layer. The inorganic layer may protect the display element layer DP-OLED from moisture and oxygen, and the organic layer may protect the display element layer DP-OLED from a foreign substance, such as dust particles. The inorganic layer may include a silicon nitride layer, a silicon oxynitride layer, a silicon oxide layer, a titanium oxide layer, or an aluminum oxide layer. The organic layer may be an acrylic-based organic layer.

The display module 200 may include the first transmission area HA1 and the second transmission area HA2, which are high transmittance areas and are defined in the active area AA. The first transmission area HA1 and the second transmission area HA2 of the rigid-type display module 200 may have closed ends. The first transmission area HA1 and the second transmission area HA2 of the flexible-type display module 200 may have open ends and may be/include through holes.

The input sensing unit 220 may be disposed on the display panel 210. The input sensing unit 220 may be disposed directly on the display panel 210 or may be coupled to the display panel 210 by an adhesive member. The input sensing unit 220 may be formed on the display panel 210 after the display panel 210 is formed.

FIG. 5 is a plan view showing the display panel 210 according to an embodiment, and FIG. 6 is a plan view showing an area XX' of FIG. 5 according to an embodiment.

Referring to FIG. 4A, FIG. 4B, FIG. 5, and FIG. 6, the display panel 210 may include a base layer BL, a plurality of pixels PX, a plurality of signal lines GL, DL, and PL, and a plurality of conductive pads PDD.

The active area AA of the display panel 210 may display the image IM, and the non-active area NAA may include/accommodate the driving circuit or the driving line. FIG. 5 shows the active area AA and the non-active area NAA of the display panel 210. The pixels PX may be disposed in the active area AA.

The base layer BL may be a stack structure including a silicon substrate, a plastic substrate, a glass substrate, an insulating film, and/or a plurality of insulating layers.

The active area AA may include a first area AR1, a second area AR2, and a third area AR3. When viewed in a plan view, the third area AR3 may surround the first area AR1 and the second area AR2. The third area AR3 may be a display area for displaying an image and may be surrounded by the non-active area NAA. The pixels PX may be disposed on the base layer BL and in the third area AR3.

At least a portion of the first area AR1 may overlap the first module area MA1 and the first transmission area HA1. The first module hole MH1 may be defined inside the first area AR1. The first module hole MH1 may be avoided/circumvented by components of the display panel 210 and maybe disposed at the first transmission area HA1. The first area AR1 may surround the first module hole MH1 in a plan view. The camera unit 500 may overlap the position of the first module hole MH1 and may be (at least partially) exposed by the first module hole MH1.

At least a portion of the second area AR2 may overlap the second module area MA2 and the second transmission area HA2. The second module hole MH2 may be defined inside the second area AR2. The second module hole MH2 may be avoided/circumvented by components of the display panel 210 and may be disposed at the second transmission area HA2. The second area AR2 may surround the second module hole MH2 in a plan view. The infrared ray unit 600 may overlap the position of the second module hole MH2 and may be (at least partially) exposed by the second module hole MH2. According to an embodiment, the infrared ray unit 600 may be provided in place of one or more pixels disposed adjacent to the first module hole MH1, such that the second module hole MH2 may not be implemented.

No pixels PX for displaying an image may be disposed on the first area AR1 and the second area AR2 of the base layer BL. Accordingly, the first area AR1 and the second area AR2 may be high transmittance areas (and non-display areas) in the active area AA. The pixels PX may be disposed on the third area AR3 of the base layer BL. The third area AR3 may be a low transmittance area (and a display area) in the active area AA. Here, the high transmittance area may mean an area having a higher transmittance than the low transmittance area.

The high transmittance areas AR1 and AR2 may be surrounded by the low transmittance area AR3 in a plan view. The high transmittance areas AR1 and AR2 may overlap the first transmission area HA1 and the second transmission area HA2 on the display module 200 and may overlap the first and second module areas MA1 and MA2 (refer to FIG. 2) of the electronic apparatus EA.

The signal lines GL, DL, and PL may be connected to the pixels PX to apply electrical signals to the pixels PX. Among the signal lines included in the display panel 210, a scan line GL, a data line DL, and a power line PL are shown in FIG. 5 as a representative example. The signal lines may further include at least one of an initialization voltage line and a light emitting control line. The signal lines GL, DL, and PL may be disposed on the third area AR3 of the base layer BL.

The pixel PX may include a first transistor TR1, a capacitor CP, a second transistor TR2, and a light emitting element OLED. The first transistor TR1 may be a switching device that controls an ON/OFF of the pixel PX. The first transistor TR1 may transmit or block a data signal applied thereto through the data line DL in response to a scan signal applied thereto through the scan line GL.

The capacitor CP may be connected to the first transistor TR1 and the power line PL. The capacitor CP may be charged with electric charges in amount corresponding to an electric potential difference between the data signal provided from the first transistor TR1 and a first power signal applied to the power line PL.

The second transistor TR2 may be connected to the first transistor TR1, the capacitor CP, and the light emitting element OLED. The second transistor TR2 may control a driving current flowing through the light emitting element OLED in response to the amount of the electric charges charged in the capacitor CP. A turn-on time of the second transistor TR2 may be determined by the amount of the electric charges charged in the capacitor CP. The second transistor TR2 may apply the first power signal provided through the power line PL to the light emitting element OLED during its turn-on time.

The light emitting element OLED may generate the light or may control an amount of the light in response to the electrical signals. The light emitting element OLED may include an organic light emitting element or a quantum dot light emitting element.

The light emitting element OLED may be connected to a power terminal VSS to receive a second power signal different from the first power signal provided through the power line PL. The driving current corresponding to a difference between the electrical signals provided from the second transistor TR2 and the second power signal may flow through the light emitting element OLED, and the light emitting element OLED may generate the light corresponding to the driving current.

The conductive pads PDD may include first pads D1 and a second pad D2. The first pads D1 may be connected to data lines DL. The second pad D2 may be electrically connected to the power line PL. Electrical signals may be provided through the conductive pads PDD to the pixels PX. The conductive pads PDD may further include pads to receive other electrical signals in addition to the first pad D1 and the second pad D2.

FIG. 7 is a plan view showing the input sensing unit according to an embodiment.

Referring to FIG. 7, the input sensing unit 220 may be disposed on the display panel 210 (refer to FIG. 2). The input sensing unit 220 may be disposed directly on the display panel 210 or may be coupled to the display panel 210 by an adhesive member. The input sensing unit 220 may be formed on the display panel 210 after the display panel 210 is formed.

The input sensing unit 220 may include a first sensing electrode TE1, a second sensing electrode TE2, a plurality of sensing lines TL1, TL2, and TL3, and a plurality of sensing pads PDT.

The first sensing electrode TE1 and the second sensing electrode TE2 may be disposed in the active area AA. The input sensing unit 220 may obtain information on the external input TC (refer to FIG. 1) based on a variation in capacitance between the first sensing electrode TE1 and the second sensing electrode TE2.

The first sensing electrode TE1 may include first sensing patterns SP1 and first connection patterns BP1. At least one first connection pattern BP1 may be connected to two first sensing patterns SP1 adjacent to each other. The second sensing electrode TE2 may include second sensing patterns SP2 and second connection patterns BP2. At least one second connection pattern BP2 may be connected to two second sensing patterns SP2 adjacent to each other.

The sensing lines TL1, TL2, and TL3 may be disposed in the non-active area NAA. The sensing lines TL1, TL2, and TL3 may include a first sensing line TL1, a second sensing line TL2, and a third sensing line TL3.

The first sensing line TL1 may be connected to the first sensing electrode TE1. The second sensing line TL2 may be connected to one end of the second sensing electrode TE2. The third sensing line TL3 may be connected to the other end of the second sensing electrode TE2. The other end of the second sensing electrode TE2 may be opposite to the one end of the second sensing electrode TE2.

The second sensing electrode TE2 may be connected to the second sensing line TL2 and the third sensing line TL3. Accordingly, a sensitivity with respect to an area of the second sensing electrode TE2, which is longer than the first sensing electrode TE1, may be uniformly maintained. The third sensing line TL3 may be optional.

The sensing pads PDT may be disposed in the non-active area NAA. The sensing pads PDT may include first sensing pads T1, second sensing pads T2, and third sensing pads T3. The first sensing pad T1 may be connected to the first sensing line TL1 and may be electrically connected to the first sensing electrode TE1. The second sensing pad T2 may be connected to the second sensing line TL2, and the third sensing pad T3 may be connected to the third sensing line TL3. The second sensing pads T2 and the third sensing pads T3 may be electrically connected to the second sensing electrode TE2.

Some of the components of the input sensing unit 220 may be (partially) removed from and/or may avoid areas corresponding to the first transmission area HA1 and the second transmission area HA2. The first module hole MH1 and the second module hole MH2 in the first transmission area HA1 and the second transmission area HA2 may penetrate the input sensing unit 220. For example, at least a portion of the first sensing electrode TE1 and a portion of the second sensing electrode TE2 may not be disposed in the first transmission area HA1 and the second transmission area HA2 due to the first module hole MH1 and the second module hole MH2. The first sensing electrode TE1 may include reduced/recessed/smaller first sensing patterns SP1 at the first transmission area HA1 and the second transmission area HA2. The second sensing electrode TE2 may include reduced/recessed/smaller second sensing patterns SP2 at the first transmission area HA1 and the second transmission area HA2.

Therefore, the camera unit 500 (refer to FIG. 2) and the infrared ray unit 600 (refer to FIG. 2) may not be covered by the first sensing electrode TE1 or the second sensing electrode TE2. Thus, the sensing sensitivity of the camera unit 500 and the infrared ray unit 600 may be satisfactory.

Figure 8:
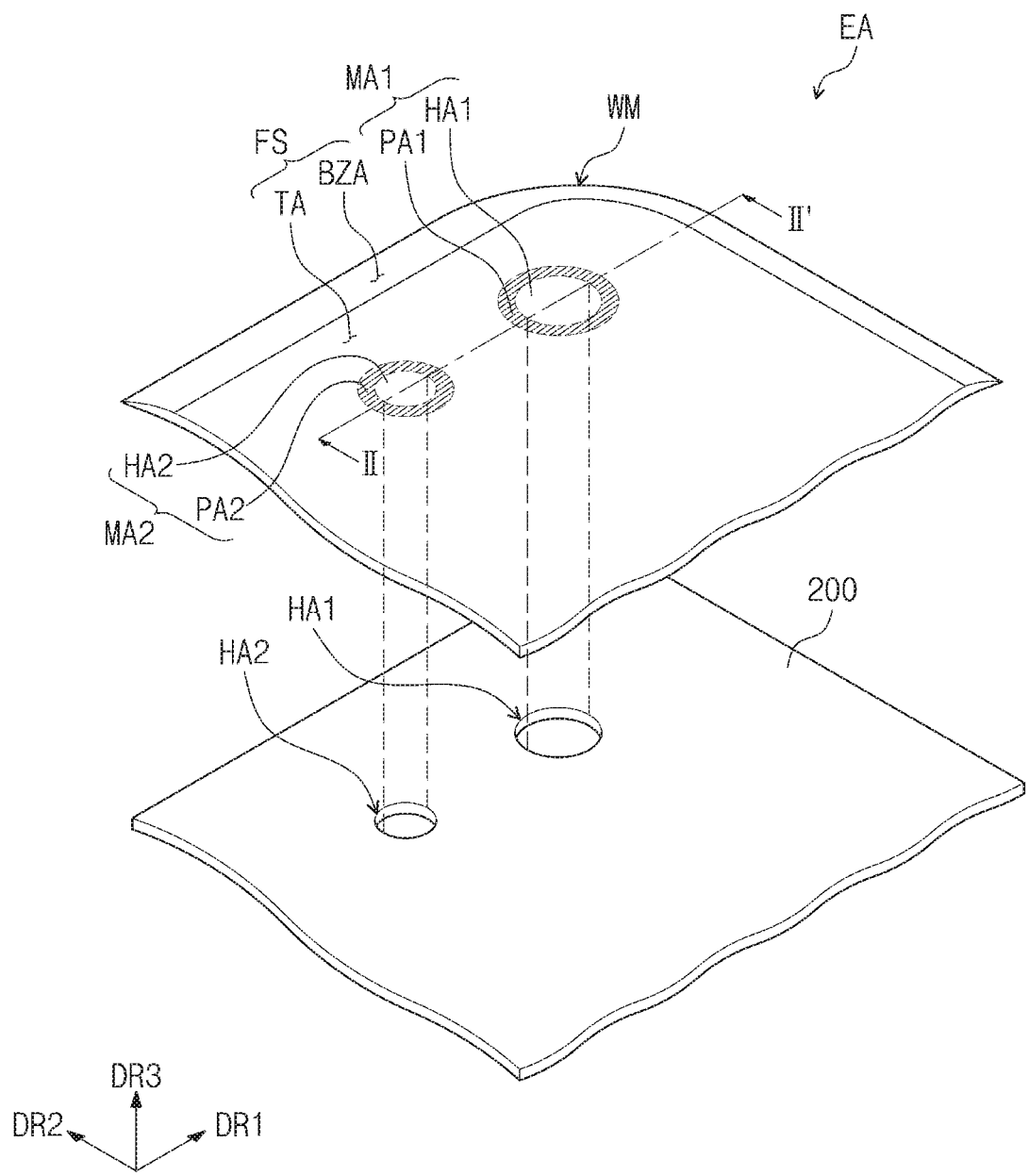
FIG. 8 is an exploded view showing a high transmittance area of an electronic apparatus according to an embodiment.
Figure 9:
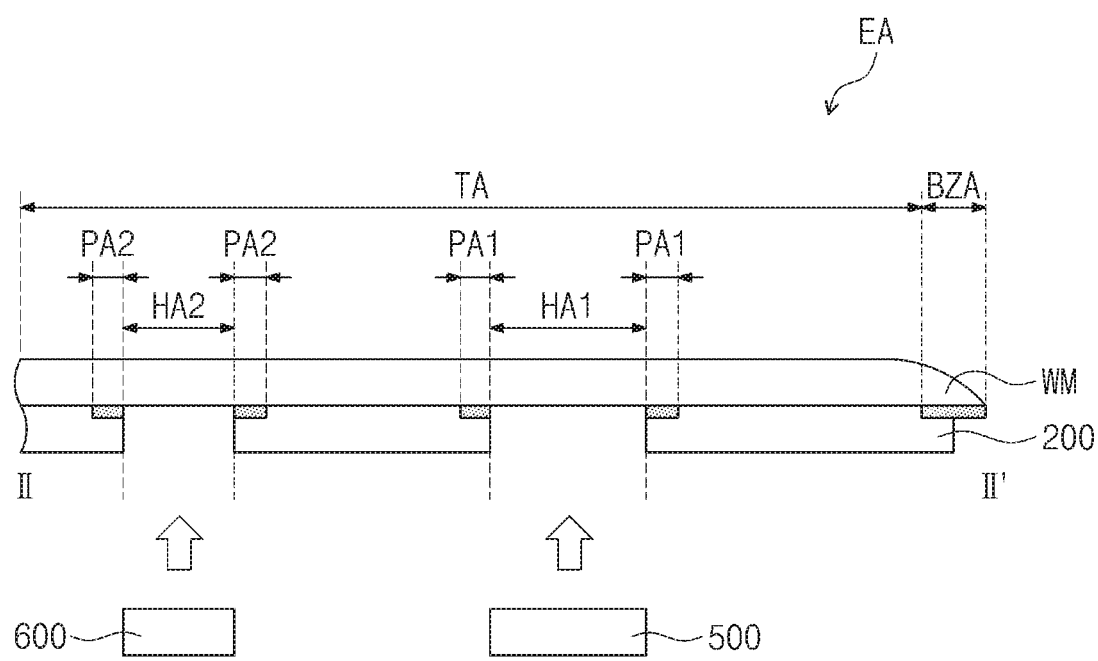
FIG. 9 is a cross-sectional view taken along a line II-II' shown in FIG. 8 according to an embodiment.

FIG. 8 is an exploded view showing high transmittance areas of the electronic apparatus EA according to an embodiment, and FIG. 9 is a cross-sectional view taken along a line II-II' shown in FIG. 8 according to an embodiment.

Referring to FIGS. 8 and 9, a window WM may provide the front surface of the electronic apparatus EA. The window WM may be disposed on the front surface of the display module 200 to protect the display module 200. The window WM may include a glass substrate, a sapphire substrate, or a plastic film.

The window WM may include a transparent material and may span the transmission area TA and the bezel area BZA of the electronic apparatus EA. The transmission area TA may correspond to the active area AA. The transmission area TA may partially or entirely overlap the active area AA. The image IM displayed through the active area AA of the display panel 210 may be viewed through the transmission area TA.

In the electronic apparatus EA, an area in which a bezel is disposed may be defined as the bezel area BZA, and an area exposed by the bezel may be defined as the transmission area TA. The bezel may include a pattern layer and an achromatic layer. The pattern layer may provide a pattern. The achromatic layer may include an organic mixture containing a black pigment or dye. The bezel may be formed by a depositing, printing, or coating method.

The window WM may include a first light blocking area PA1 and a second light blocking area PA2. A light blocking pattern may be printed on a rear surface of the window WM in the first light blocking area PA1 and the second light blocking area PA2. The light blocking pattern may have a color/material with a high light shielding property. As an example, the light blocking pattern may include an organic mixture containing a black pigment or dye. The light blocking pattern may be printed on the display module 200 in the first light blocking area PA1 and the second light blocking area PA2. The first light blocking area PA1 may surround the first transmission area HAL and the second light blocking area PA2 may surround the second transmission area HA2. The camera unit 500 may be disposed under the first transmission area HA1, and the infrared ray unit 600 may be disposed under the second transmission area HA2. The display module 200 may transmit the infrared ray incident to the camera unit 500 through the first transmission area HA1 and may transmit the infrared ray emitted from the infrared ray unit 600 through the second transmission area HA2. A thickness and/or a height of the camera unit 500 and the infrared ray unit 600 may be equal to, smaller than, or greater than a thickness and/or a height of the display module 200.

FIGS. 10A to 10D are plan views showing the first and second transmission areas HA1 and HA2 of a display panel according to embodiments. Each of the second transmission areas HA2 may expose a corresponding infrared ray unit 600. Some structures related to one of FIGS. 10A to 10D may be combined with some structures related to another of FIGS. 10A to 10D.

Referring to FIGS. 10A to 10D, the area of the first transmission area HA1 may be greater than the area of each of the second transmission areas HA2. In the drawings, the area of a second transmission area HA2 is half the size of the first transmission area HA1. The area of the second transmission areas HA2 may be determined according to embodiments and may be smaller than that of the first transmission area HA1.

The first transmission area HA1 may be surrounded by the plural second transmission areas HA2. The second transmission areas HA2 may be disposed at left and right sides of the first transmission area HA1. The second transmission areas HA2 may be disposed above and below the first transmission area HA1. The number and positions of second transmission areas HA2 should not be limited to those shown in the figures, and may be disposed above, under, to the left, and/or to the right sides of the first transmission area HAL referring to FIG. 10A. The second transmission areas HA2 may be disposed adjacent to the first transmission area HAL The infrared ray emitted from the infrared ray modules 600 disposed under the second transmission areas HA2 may be reflected into the camera unit 500 disposed under the first transmission area HA1.

Figure 10A:
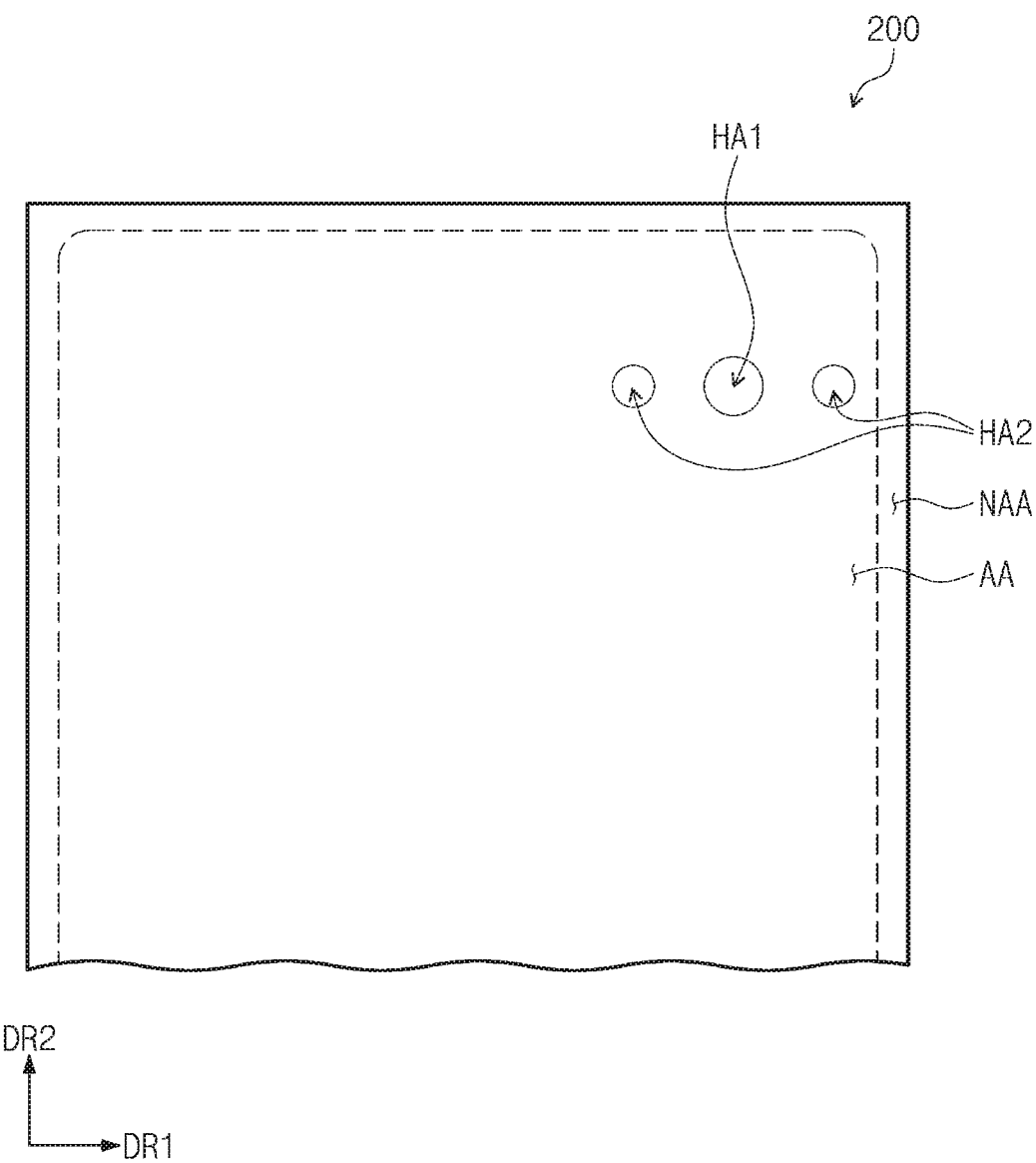
FIG. 10A, FIG. 10B, FIG. 10C, and FIG. 10D are plan views showing first and second transmission areas of a display panel according to embodiments.
Figure 10B:
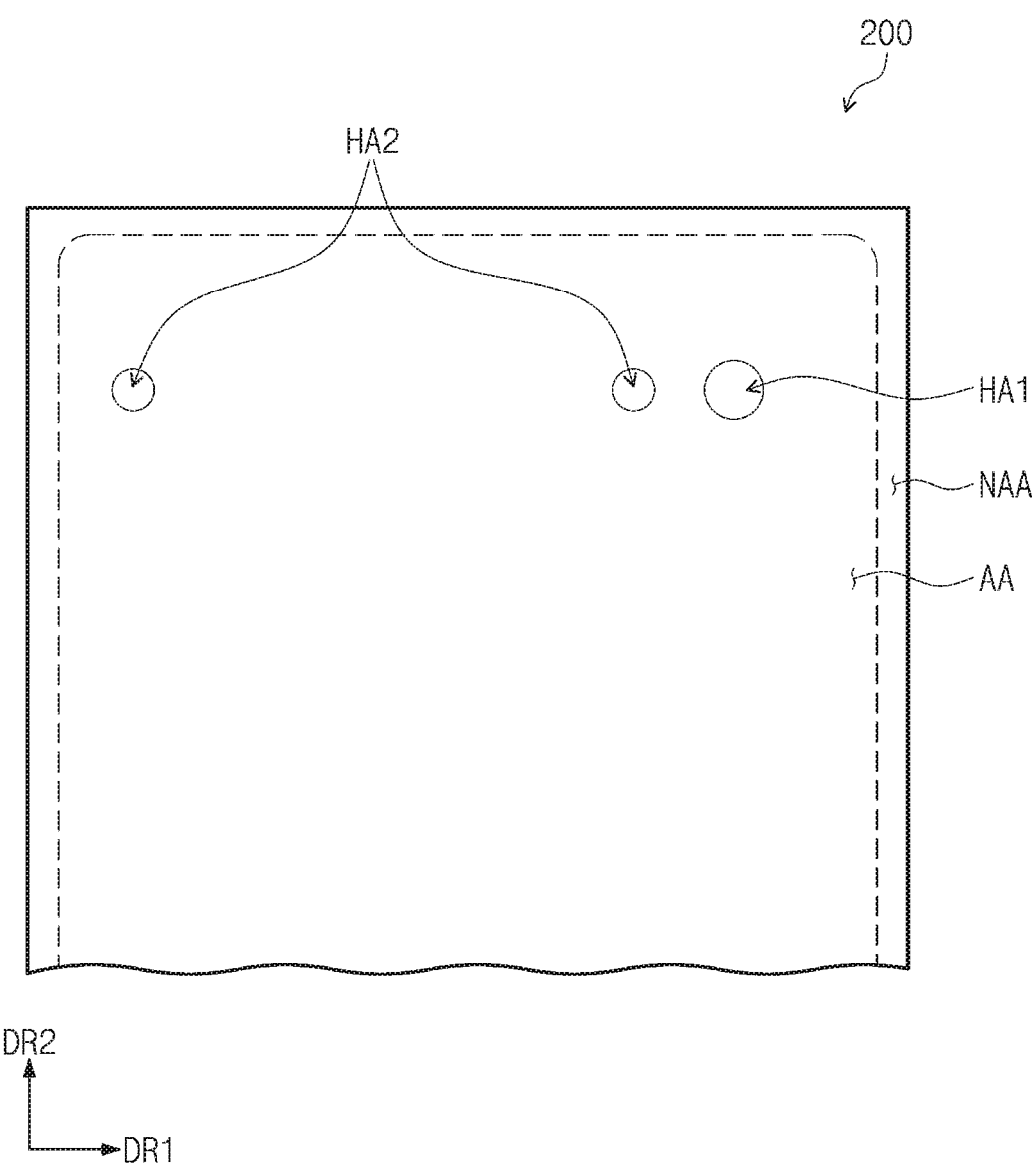

In FIG. 10B, a first second transmission area HA2 may be positioned between the first transmission area HA1 and a second second transmission area HA2. Second transmission areas HA2 may be spaced in left and right directions from the first transmission area HA1 and may be spaced in upper and lower directions from the first transmission area HA1. Second transmission areas HA2 may be spaced at regular intervals.

Figure 10C:
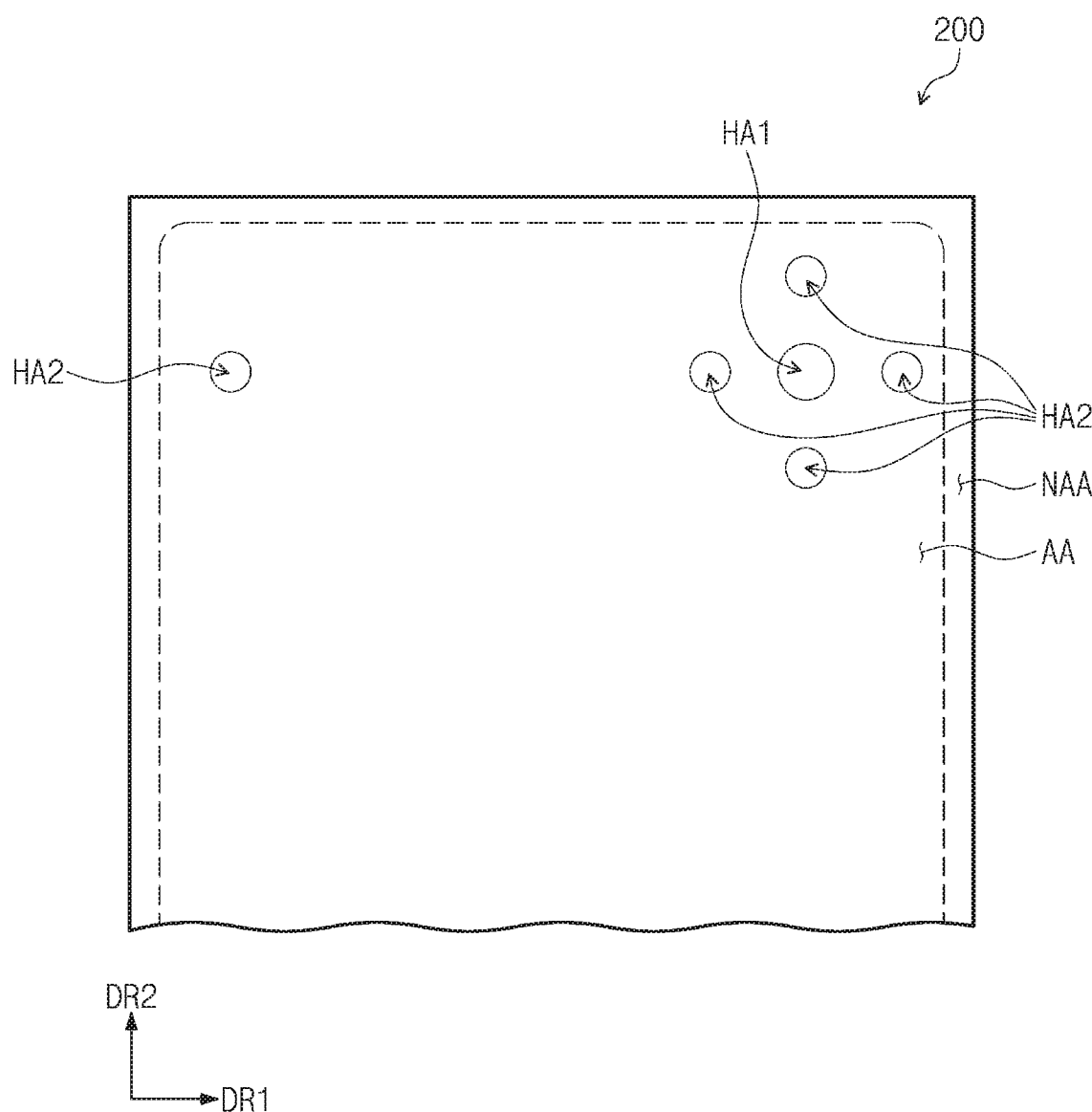

In FIG. 10C, first second transmission areas HA2 may surround the first transmission area HA1, and one or more second second transmission areas HA2 may be positioned farther from the first transmission area HA1. FIG. 10C shows four first second transmission areas HA2 surrounding the first transmission area HA1, however, more than four first second transmission areas HA2 may surround the first transmission area HA1. The one or more second second transmission areas HA2 may be disposed adjacent to the non-active area NAA. The sizes of the second transmission areas HA2 may be different from (e.g., smaller than) the sizes of the second transmission areas HA2.

Figure 10D:
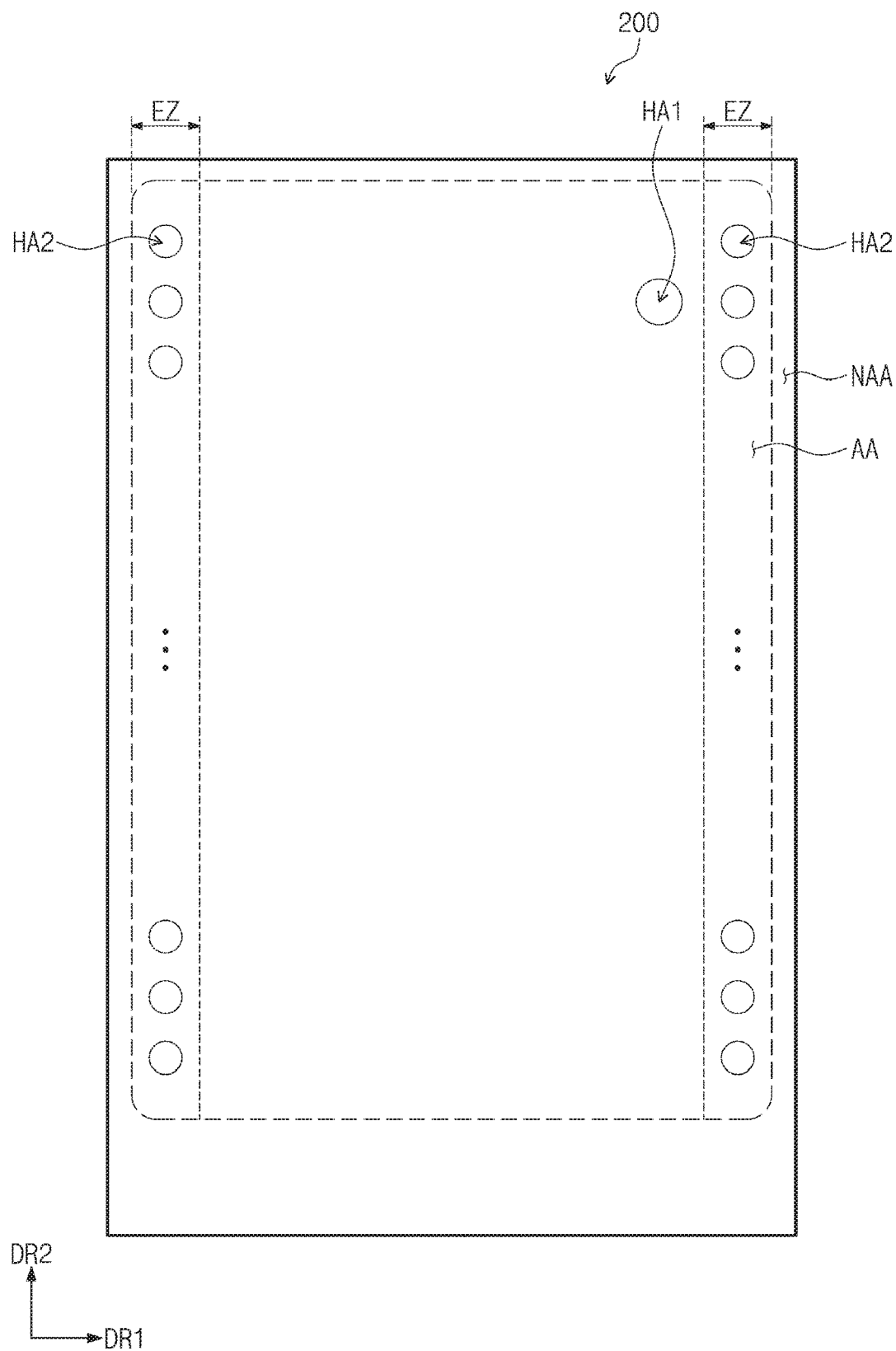

In FIG. 10D, the display module 200 may include edge areas EZ at two opposite sides of the active area AA. A plurality of second transmission areas HA2 may be disposed in each edge area EZ. The second transmission areas HA2 disposed in an edge area EZ may be aligned in the second direction DR2. Some second transmission areas HA2 may be closer to the first transmission area HA1 than others are. The first transmission area HA1 may be closer to one edge area EZ than to the other edge area EZ. The number of the second transmission areas HA2 in one edge area EZ may be greater than the number of the second transmission areas HA2 in the other edge area EZ. A size of the second transmission areas HA2 in one edge area EZ may be greater than a size of the second transmission area HA2 in the other edge area EZ.

Figure 11:
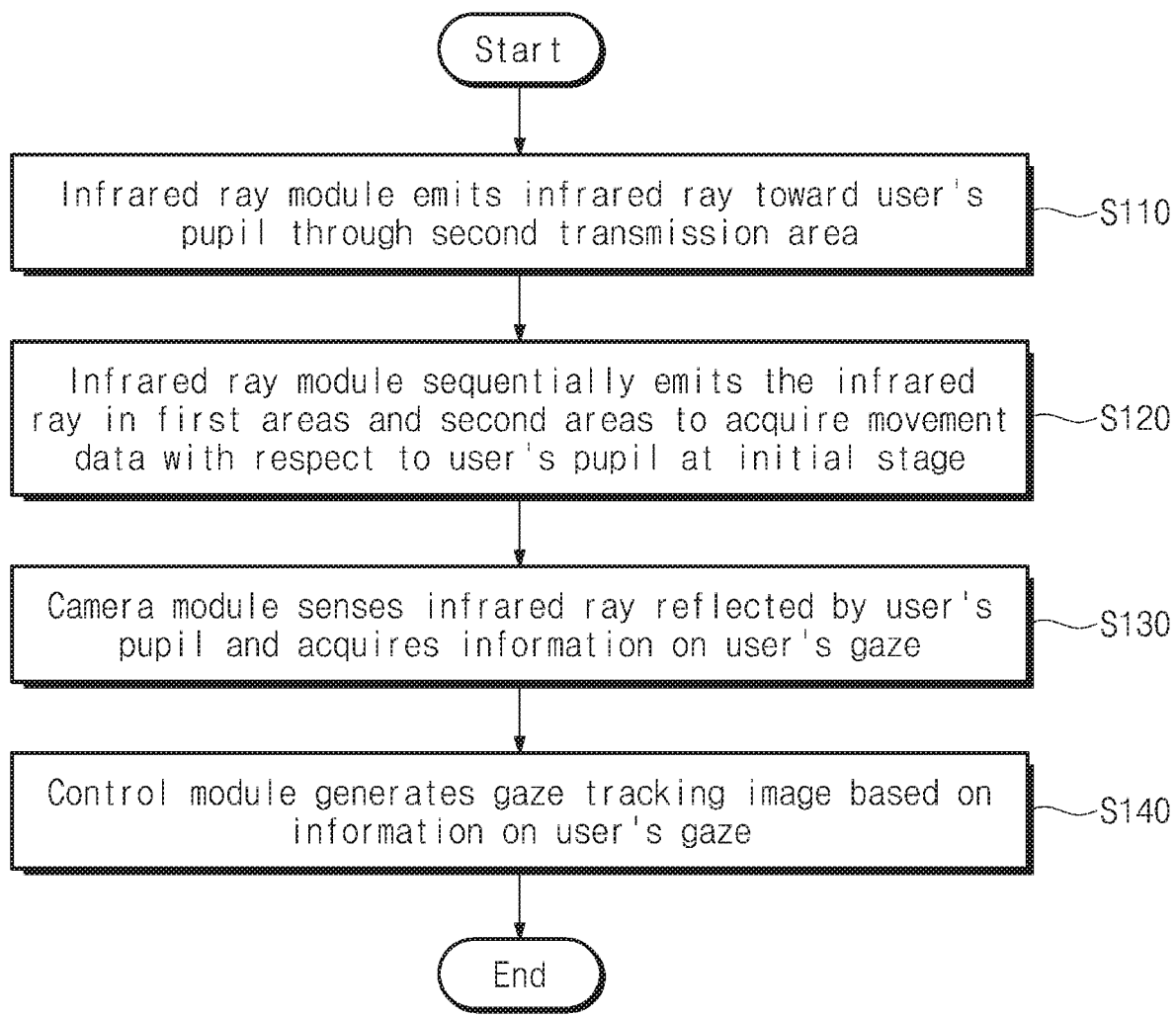
FIG. 11 is a flowchart showing an operation of an electronic apparatus according to an embodiment.

FIG. 11 is a flowchart showing an operation of an electronic apparatus according to an embodiment.

Referring to FIG. 11, an infrared ray unit 600 emits the infrared ray to the user's pupil(s) through a second transmission area HA2 (S110). Infrared ray units 600 sequentially the infrared rays through second transmission areas HA2 adjacent to the first transmission area HA1 and through second transmission areas HA2 farther the first transmission area HA1 to acquire movement data with respect to the user's pupil at an initial stage (S120). When the sequentially-emitted infrared rays are reflected by the user pupil and incident into the camera unit 500, the camera unit 500 detects the infrared rays to obtain user gaze information (S130). The control module CM generates a gaze tracking image from a raw image based on the user gaze information (S140). The control module CM may control the power supply of the power supply module PM and/or may control the input signal provided through the input sensing unit 220 in addition to generating the gaze tracking image. The display module 200 may display the gaze tracking image to the user or may display the image in accordance with the power supply or the input signal.

Although example embodiments have been described, various changes and modifications can be made within the scope defined by the attached claims.

What is claimed is:

1. An electronic apparatus comprising:
a camera module;
an infrared ray module; and
a display module comprising an active area where an image is displayed and a pixel is disposed, a non-active area adjacent to the active area, and a high transmittance area and a low transmittance area which are defined in the active area, wherein the high transmittance area comprises a first transmission area and a second transmission area, the camera module overlaps the first transmission area, and the infrared ray module overlaps the second transmission area.

2. The electronic apparatus of claim 1, further comprising a window, wherein the display module is disposed between the window and the infrared ray module and the camera module.

3. The electronic apparatus of claim 1, wherein the high transmittance area and the non-active area do not overlap the pixel, and the low transmittance area overlaps the pixel.

4. The electronic apparatus of claim 1, wherein the display module is provided with an opening defined in the high transmittance area.

5. The electronic apparatus of claim 1, wherein the display module comprises a display panel, and a first module hole and a second module hole are defined in the display panel to respectively penetrate the first transmission area and the second transmission area.

6. The electronic apparatus of claim 1, wherein a size of the second transmission area is smaller than a size of the first transmission area.

7. The electronic apparatus of claim 1, wherein the first transmission area and the second transmission area are disposed at a same quarter in the plan view.

8. The electronic apparatus of claim 1, wherein the second transmission area is provided in a plural number.

9. The electronic apparatus of claim 8, wherein edge areas are defined at both sides in a first direction of the active area, and the second transmission areas are disposed to be aligned in a second direction crossing the first direction in the edge areas.

10. The electronic apparatus of claim 9, wherein the second transmission areas disposed in the edge area on one side among the both sides are disposed adjacent to the first transmission area, and the second transmission areas disposed in the edge area on the other side among the both sides are disposed to be spaced apart from the first transmission area.

11. The electronic apparatus of claim 8, wherein the second transmission areas comprise a first area and a second area,
wherein the first area is positioned closer to the first transmission area than the second area.

12. The electronic apparatus of claim 11, wherein each of the first area and the second area is provided in a plural number, the first areas are disposed to surround the first transmission area, and the second areas are disposed adjacent to the non-active area, which is spaced apart from the first transmission area.

13. The electronic apparatus of claim 11, wherein the first areas have a size different from a size of the second areas.

14. An electronic apparatus comprising:
infrared ray units sequentially emitting emitted infrared rays;
a camera unit sequentially receiving reflected infrared rays that respectfully correspond to the emitted infrared rays;
a control module electrically connected to the camera unit, wherein at least one of the camera unit and the control module is configured to generate tracking information based on the reflected infrared rays; and
a display module electrically connected to the control module and comprising pixels, an infrared reception hole, and infrared transmission holes, wherein the pixels are configured to display an image in response to control signals provided by the control module, wherein the infrared reception hole exposes the camera unit to the reflected infrared rays, and wherein the infrared transmission holes respectfully expose the infrared ray units to permit transmission of the emitted infrared rays.

15. The electronic apparatus of claim 14, wherein the infrared transmission holes include a first infrared transmission hole and a second infrared transmission hole, and wherein the first infrared transmission hole is positioned closer to the infrared reception hole than the second infrared transmission hole is.

16. The electronic apparatus of claim 14, further comprising:
a power supply module electrically connected to the control module; and
an input sensing unit electrically connected to the control module, wherein the control module controls at least one of the power supply module and the input sensing unit based on the tracking information.

17. The electronic apparatus of claim 14, wherein the infrared transmission holes include first-type infrared transmission holes and second-type infrared transmission holes, wherein the first-type infrared transmission holes surround the infrared reception hole, and wherein the second-type infrared transmission holes are aligned with each other and are spaced at equal intervals.

18. An electronic apparatus comprising:
a display module comprising pixels, an infrared reception hole, and an infrared transmission hole, wherein the pixels surround each of the infrared reception hole and the infrared transmission hole and are configured to display an image;
a window disposed on the display module;
a camera unit exposed by the infrared reception hole; and
an infrared ray unit exposed by the infrared transmission hole.

19. The electronic apparatus of claim 18, further comprising: a first light blocking member surrounding the infrared reception hole and disposed on at least one of the window and the display module; and a second light blocking member surrounding the infrared transmission hole and disposed on one or more of the window and the display module.

20. The electronic apparatus of claim 19, further comprising a bezel member disposed along an edge of the window, wherein a material of the bezel member is identical to at least one of a material of the first light blocking member and a material of the second light blocking member.

* * * * *